United States Patent [19]
Noel et al.

[11] Patent Number: 5,142,185
[45] Date of Patent: Aug. 25, 1992

[54] ACOUSTIC ELECTRIC SURFACE WAVE DEVICE

[75] Inventors: Benoit Noel, Voisins le Bretonneux; Jean-Louis Foure, Verrieres le Buisson, both of France

[73] Assignee: Electronique Serge Dassault, Saint-Cloud, France

[21] Appl. No.: 497,859

[22] Filed: Mar. 22, 1990

[30] Foreign Application Priority Data

Aug. 10, 1989 [FR] France .................. 89 10784

[51] Int. Cl.⁵ .................................. H01L 41/08
[52] U.S. Cl. ..................... 310/313 B; 310/313 D; 310/313 C; 333/154
[58] Field of Search .............. 310/313 B, 313 C; 333/154

[56] References Cited
U.S. PATENT DOCUMENTS

| | | | |
|---|---|---|---|
| 3,845,420 | 10/1974 | Holland et al. | 310/313 C X |
| 3,975,697 | 8/1976 | Paige | 310/313 C X |
| 4,477,784 | 10/1984 | Maerfeld et al. | 333/154 X |
| 4,633,117 | 12/1986 | Bloch et al. | 310/313 B |
| 4,878,036 | 10/1989 | Yatsuda et al. | 310/313 B X |
| 4,912,356 | 3/1990 | Mariani et al. | 310/313 C |

Primary Examiner—Mark O. Budd
Attorney, Agent, or Firm—Toren, McGeady & Associates

[57] ABSTRACT

A surface acoustic electric wave device of the type comprising, over a large face of a planar piezo-electric substrate, a first row of parallel conductive fingers having an individual geometry chosen and distributed according to a chosen distribution arrangement along this row, a second row of parallel conductive fingers having an individual geometry chosen and distributed according to a chosen distribution arrangement along this row, the second row being interspaced from the first so as to allow a propagation of surface acoustic waves between the fingers of the first row and those of the second, which imparts to the device spectral and/or temporal characteristics defined by the acoustic propagation and the frequency selectivity due to the geometry of the fingers.

The geometries of the fingers are chosen, in correspondence as from one row to the other, in order to obtain an acoustic coupling with a wide frequency bandwidth, and one of the two distribution arrangements or sequences for the attachment of the fingers is modified substantially periodically.

11 Claims, 4 Drawing Sheets

ACOUSTIC ELECTRIC SURFACE WAVE DEVICE

FIELD OF THE INVENTION

The invention concerns surface electric/acoustic wave transducers.

To produce such transducers one starts with a thin planar piezo-electric substrate. By micro-lithography or by other micro machining techniques on a large face of this substrate two rows of thin conductive fingers are formed which are parallel to each other in each row.

Under certain conditions of use, a coupling will occur between the two rows of fingers by surface acoustic waves which are propagated in the piezo-electric substrate. This coupling has certain temporal and frequency characteristics depending on the geometry of the fingers, mainly on their width, as well as on the phenomena of acoustic propagation from one row of fingers to the other.

So far, these devices have been mainly used for relatively narrow bandwidths. They are then satisfactory and their behaviour can be reasonably well predicted.

They are not so satisfactory or predictable for a wide or very wide bandwidth applications. A "very wide band" here means that the effective bandwidth can be as great as the value of its median frequency.

PRIOR ART

In these wide bandwidth applications, the two rows of fingers are generally inclined to the perpendicular with respect to the direction of the fingers; moreover, the median direction of these rows is most usually curvilinear. One endeavours to determine that number of fingers of the one row and the other which will cooperate for providing the acoustic coupling, and to do so for each given frequency value inside the operating band.

In one of the known structures, termed single finger structures, the width of one finger equals a quarter of the instantaneous (local) acoustic wavelength for the associated frequency. The same applies to the distance between adjacent fingers. The constraints of the conventional micro-lithographic techniques have the result that these structures can at present operate up to approximately 2 GHz, (fundamental frequency). They may have a good frequency and phase response, but on the other hand they suffer from a temporal interference response, termed a triple echo and situated at approximately 20 to 25 dB below the effective signal.

Consideration has been given to using structures termed "binary finger" structures, where the width of the fingers is one eighth of the instantaneous acoustic wavelength. The temporal triple echo interference can then be reduced down to 40 to 45 dB below the effective signal. But these structures are difficult to produce. With the same micro-lithographic sub-micronic precision, they only allow frequencies to be obtained that are twice as low as those of the single finger structures.

Moreover, the use of binary fingers stimulates, in its turn, a triple harmonic interference frequency response which can be situated at −15 dB below the basic response and whose bandwidth is three times wider than that of the basic response.

The expert will be perfectly familiar with the drawbacks deriving from the above observations.

Thus, at present, there does not exist any really satisfactory solution when it is desirable to operate in a wide bandwidth, in particular when it is intended to operate at higher frequencies with a reduced temporal triple echo.

OBJECTS OF THE INVENTION

It is a first object of the invention to provide a solution to the above problem.

It is a further object of the invention to provide an improved surface electric/acoustic/electric wave transducer, of the type comprising, over a large face of a planar piezo-electric substrate, a first row of parallel conductive fingers having an individual geometry chosen and distributed according to a chosen distribution arrangement along this row, and a second row of parallel conductive fingers having an individual geometry chosen and distributed according to a chosen distribution arrangement along this row, wherein the second row is interspaced from the first so as to allow a propagation of surface acoustic waves between the fingers of the first row and those of the second.

It is a still further object of the invention to provide such a transducer in which the coupling has spectral and/or temporal characteristics defined by the acoustic propagation and the frequency selectivity due to the geometry of the fingers.

SUMMARY OF THE INVENTION

According to the invention, there is provided a surface acoustic-electric wave device of the type comprising, over a large face of a planar piezo-electric substrate, (a) a first row of parallel conductive fingers having an individual geometry chosen and distributed according to a chosen distribution arrangement along this first row, (b) a second row of parallel conductive fingers having an individual geometry chosen and distributed according to a chosen distribution arrangement along this second row, the second row being interspaced from the first so as to allow a propagation of surface acoustic waves between said fingers of said first row and said fingers of said second row, which imparts to the device spectral and/or temporal characteristics defined by the acoustic propagation and the frequency selectivity due to the geometry of said fingers, wherein (c) the geometries of said fingers are chosen, in correspondence as from one row to the other, in order to obtain an acoustic coupling with a wide frequency bandwidth, and wherein (d) the distribution arrangement or sequence for the attachment of said fingers of one of said first and second rows is modified substantially periodically.

Although other arrangements could be envisaged, it is at present felt that one, and only one, of the two distributions should be thus modified, the other retaining a strictly regular distribution of its fingers, in principle with the interspacing between the fingers and the width of the fingers both equal to approximately a quarter of the length of the acoustic wave.

It will have been observed that the above characteristic concerns in essence the fingers, and only the fingers. Many arrangements of the rows may therefore be considered which will conform to the invention.

Provided the fingers of the two rows are parallel to each other, they may be given individual geometries that progressively vary along each row to cover a very wide frequency bandwidth, while corresponding to each other from one row along the other perpendicular to the common direction of these fingers.

In other words, the width of one finger is practically always a predetermined sub-multiple of the halflength of the desired instantaneous surface acoustic wave, being in principle the sub-multiple of the order of 2, that is to say, a quarter of the wavelength. The distance between adjacent fingers is substantially equal to this submultiple, that is to say, to a quarter of the wavelength. However, it becomes a multiple thereof, in principle of the order of 2, for the "places" where the attachment sequence of the fingers is modified.

Very advantageously, these "places" are provided after every third or fourth finger.

It has already been disclosed that the first and second rows generally extend along curvilinear axes. They may, nevertheless, be associated with general directions.

In a first group of devices, these general directions are inclined differently along the perpendicular in relation to the direction of the fingers. The device then has the characteristics of a dispersive line.

In another group, the general directions of the first and second rows have substantially the same inclination along the perpendicular to the direction of the fingers. The device then has the characteristics of a nondispersive delay line.

BRIEF DESCRIPTION OF THE DRAWINGS

Other objects and advantages of the invention will be apparent on examining the following detailed description given with reference to the attached drawings wherein.

DESCRIPTION OF THE PREFERRED EMBODIMENTS

It is clear that the geometry is very important for the present invention. Moreover, the attached drawings are, in essence, of a definite nature. They should, therefore be considered as incorporated in the description and they can serve, not only to obtain a better understanding of the description but also to contribute to the definition of the invention if required.

Figure 1:
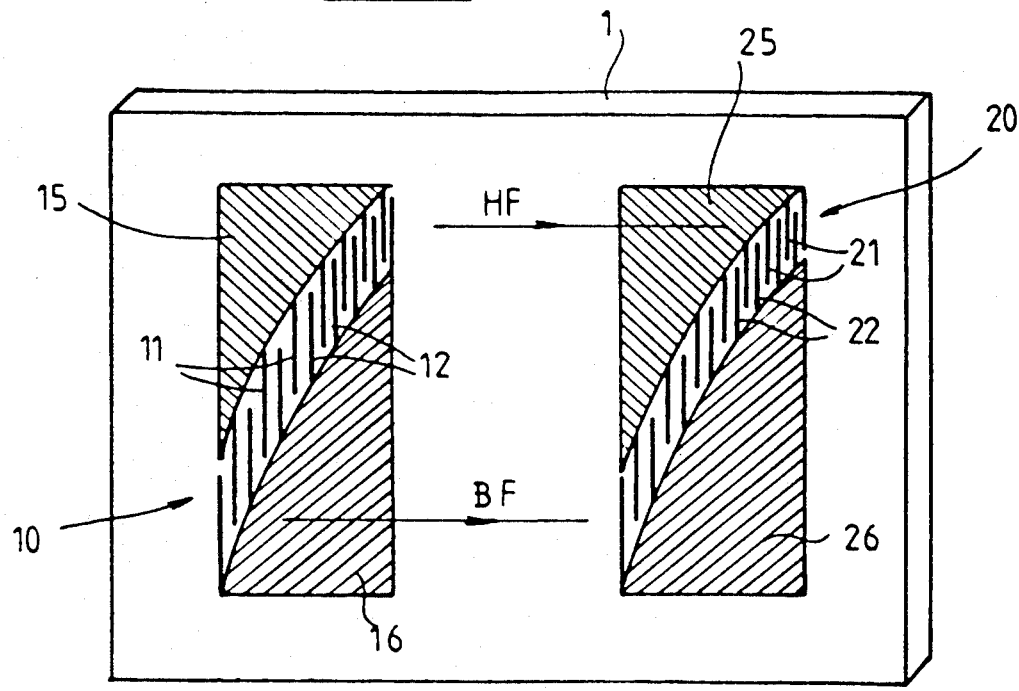
FIG. 1 is a diagram illustrating a first group of devices to which the invention may be applied.
Figure 2:
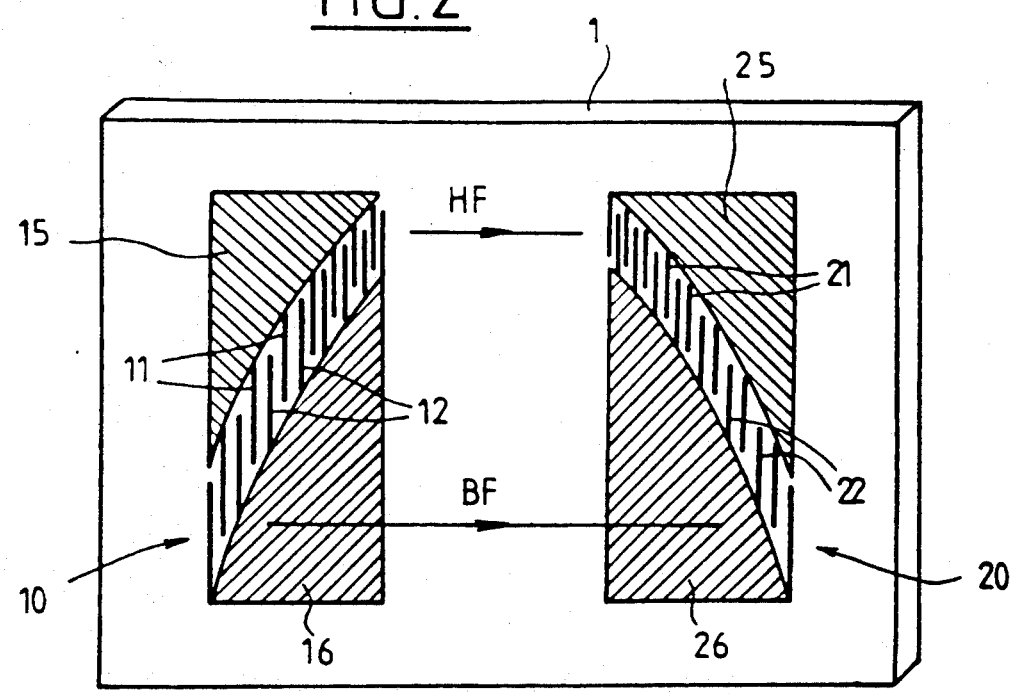
FIG. 2 is a diagram illustrating a second group of devices to which the invention may be applied.

FIGS. 1 and 2 show a piezo-electric substrate 1, whose thickness can be of the order of 0.5 mm. Its other dimensions range from a few millimetres to at least a few tens of millimetres.

Two rows 10 or 20 of fingers are disposed over a large face of the substrate.

Here the row of fingers 10 is bordered by two electrically separated conductive zones 15 and 16, made, for example, of 200 nanometres thick aluminium. The fingers 11 are connected to the zone 15, while the fingers 12 are connected to the zone 16, on an alternating basis.

Similarly, the row 20 is provided with zones 25 and 26 with an alternating interconnection of the fingers 21 to the zone 25, and of the fingers 22 to the zone 26.

FIGS. 1 and 2 show, moreover, that in the upper portion the fingers are closer to each other. They are also narrower, which here is not shown in the drawings. It follows from this that in the upper portion of FIGS. 1 and 2, the coupling between the fingers situated on the same horizontal will take place in the higher frequency portion of the range in question. On the other hand, at the bottom of FIGS. 1 and 2, the fingers are interspaced more widely and their individual width is greater. The coupling will here affect the lower frequency portion of the range in question.

The difference between FIGS. 1 and 2 is as follows:

In FIG. 1 the general directions of the rows wherein the rows 10 and 20 extend are substantially parallel (to the extent that one can refer to a parallelism of curvilinear directions). As a result, the propagation time of the wave of row 10 to the row 20 will be substantially the same for all the frequencies. The device illustrated in FIG. 1 may, therefore, be considered as a non-dispersive delay line.

The situation is different in FIG. 2, where it will be observed that the distance between the fingers progressively diminishes as one passes from the bottom of the Figure affecting the lower frequencies, to the top of the Figure affecting the higher frequencies. This is, therefore, a dispersive line having frequency selection properties.

The invention applies both to the devices described above (known under the name of "down chirp" in the AngloSaxon literature) and to the devices called "up chirp" wherein the width of the fingers and the distance between the fingers progressively increases as one passes from the bottom of the Figure (affecting the higher frequencies) to the top of the Figure (affecting the lower frequencies).

In principle, the two rows are in all cases inclined in relation to the propagation direction of the acoustic waves. This is why these structures are frequently called SLT (for SLanted Transducer) or have even retained their old name of "Slanted Acoustic Correlator" or SAC.

The Applicants have been interested in the application of these structures in order to make dispersive lines and in particular, delay lines with a very wide bandwidth.

Figure 3:
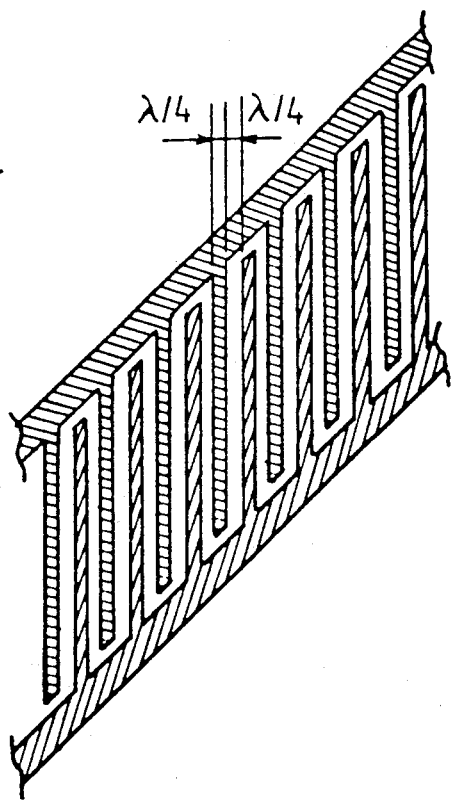
FIG. 3 illustrates a so-called "single finger" structure, whilst

FIG. 3 illustrates in greater detail a row of fingers suitable for use in the structures of FIGS. 1 and 2. In the above-mentioned applications there have so far been used, for the two rows of fingers, structures which are in principle strictly identical.

Here in FIG. 3 the structure used is of the socalled single finger type. That is to say, the width of the fingers is of the order of a quarter of the length of the instantaneous acoustic wave, as is the interspacing between them. This is the width measured in the propagation direction of the acoustic waves, that is to say in the direction perpendicular to the fingers. There is no need to take into account the direction along which the row is itself extending.

Figure 3A:
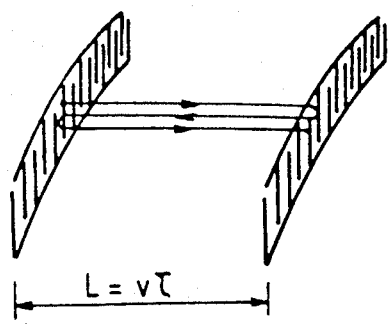
FIGS. 3A and 3B illustrate the triple echo interference of this structure.
Figure 3B:
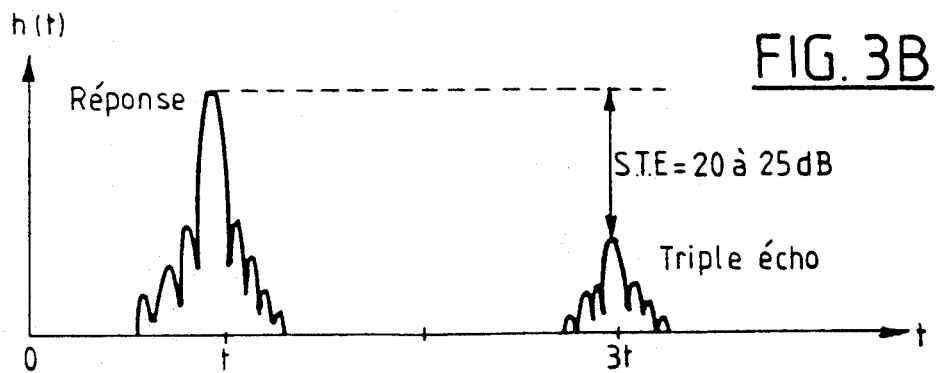

FIG. 3A schematically shows the level at which the triple echo may be situated between the two rows of fingers thus constituted. It will, indeed, be understood that in view of the geometry of the fingers, three paths can easily materialise between the transducers without any great loss. FIG. 3B shows that the triple echo response thus takes place at time 3t, which is three times the fundamental response time, while its level STE is situated 20 to 25 dB below the level of the main response.

It is clear that, at least for certain applications, such a response can be an extreme nuisance.

There is therefore a definite disadvantage to the single finger structure which, all other things being equal, is the easiest to produce.

Figure 4:
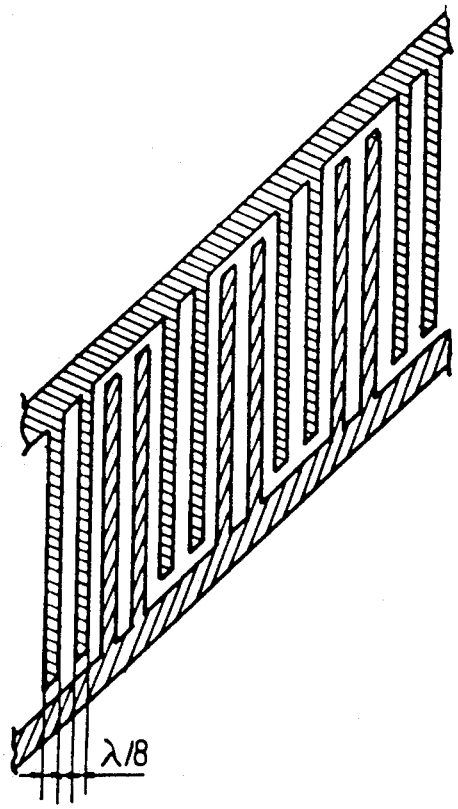
FIG. 4 illustrates the so-called "binary finger" structure, whilst

Binary finger structures such as those of FIG. 4 are also known.

In this case, the width of the fingers is one eighth of the instantaneous wavelength, as is their interspacing.

Figure 4A:
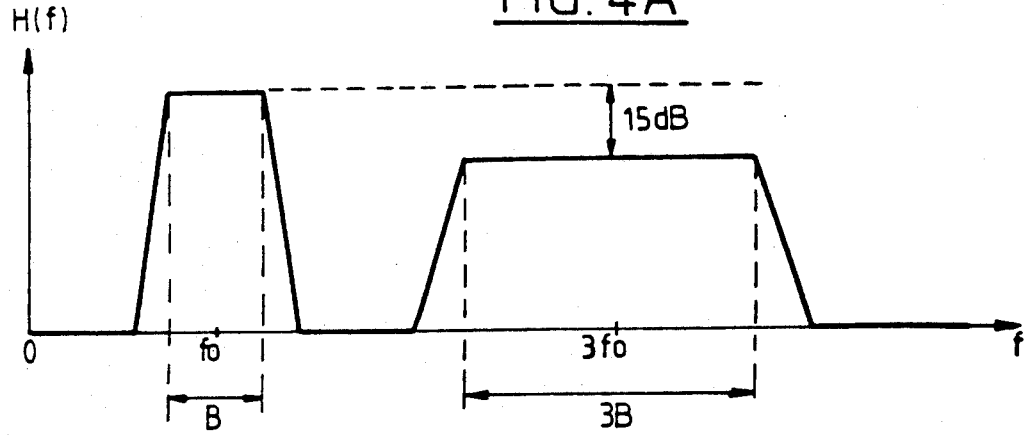
FIG. 4A is a time base diagram illustrating its third harmonic interference response.

As has already been indicated, the use of the two binary finger structures for the rows 10 and 20, causes the suppression of the triple echo to be lowered down to 40 to 45 dB, which would be satisfactory. Unfortunately the binary fingers stimulate a third harmonic frequency response (FIG. 4A), which lies not just at a level only 15 dB below the fundamental response, but has, above all, a bandwidth 3B, where B is the bandwidth of the fundamental response.

This drawback may be acceptable in a narrow bandwidth, when the minimum frequency of the band is distinctly higher than a third of its maximum frequency. However, when it is intended to operate over a wide bandwidth this is, in practice, unacceptable.

Moreover at the established performance level of the micro-lithographic techniques, the binary finger structures attain only half of the frequency attainable with single finger structures.

Going against the natural tendency lying in the use of identical structures for the two rows, at least when it is intended to operate over a wide bandwidth, it has been found that in certain conditions it is possible to use different geometries for the fingers of the two rows.

More exactly, the individual geometry of the fingers is not fundamentally modified. What will be modified in one of the two rows (and in principle only in one of the two rows), is the distribution of the fingers along the row, and more exactly the sequencing of their attachment.

Figure 5:
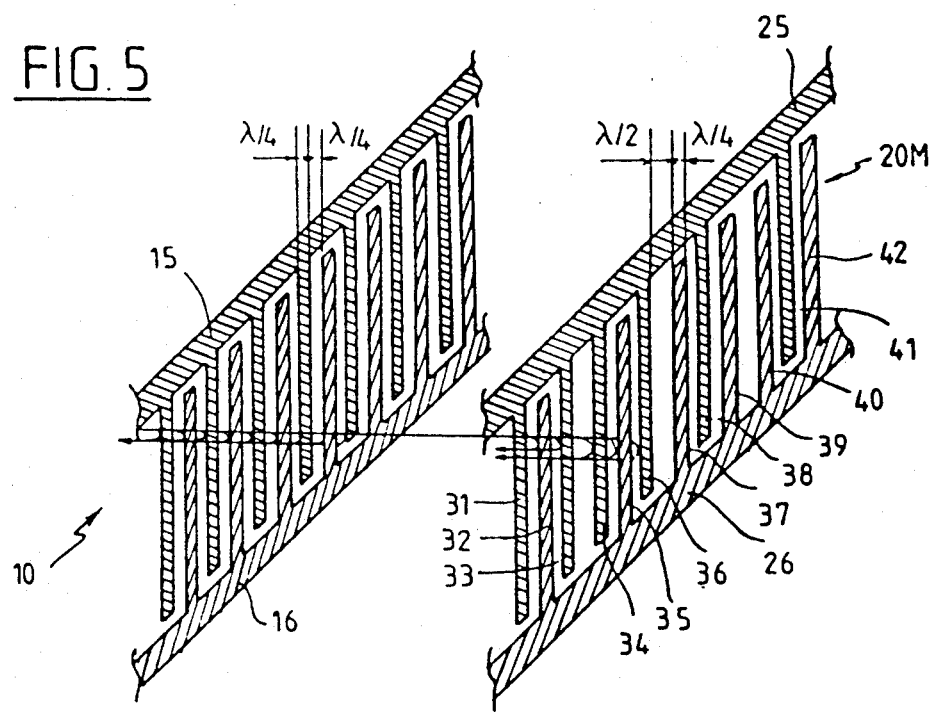
FIG. 5 illustrates an example of the improved devices in accordance with the invention.

This is illustrated in FIG. 5, where the single finger transducer of FIG. 3 is seen on the left hand side.

The right hand side shows a partial representation of the new structure of the present invention which is characterised in that, periodically, the interspacing between certain adjacent fingers is caused to pass to one half of the wavelength, and in that the attachment sequence of the fingers is modified.

This allows the overall response of the device to be improved, because of the benefit of the excellent frequency filtering of the single finger structure, whilst the new structure on the right hand side, although having a more complex harmonic response, has on the other hand, an excellent temporal response.

There will, therefore, be consecutive groups of fingers having the following properties:

two consecutive groups, such as 31 to 33 and 34 to 36, are attached to the same conductive zone; here two fingers are attached each time to the zone 25, for one attached to the zone 26;

conversely, in the following groups comprising the fingers 37 to 39 and 40 to 42, the same structure will be obtained, but attached symmetrically, that is to say that only one finger is attached to the conductive zone 25, while two fingers are attached to the conductive zone 26.

Figure 6:
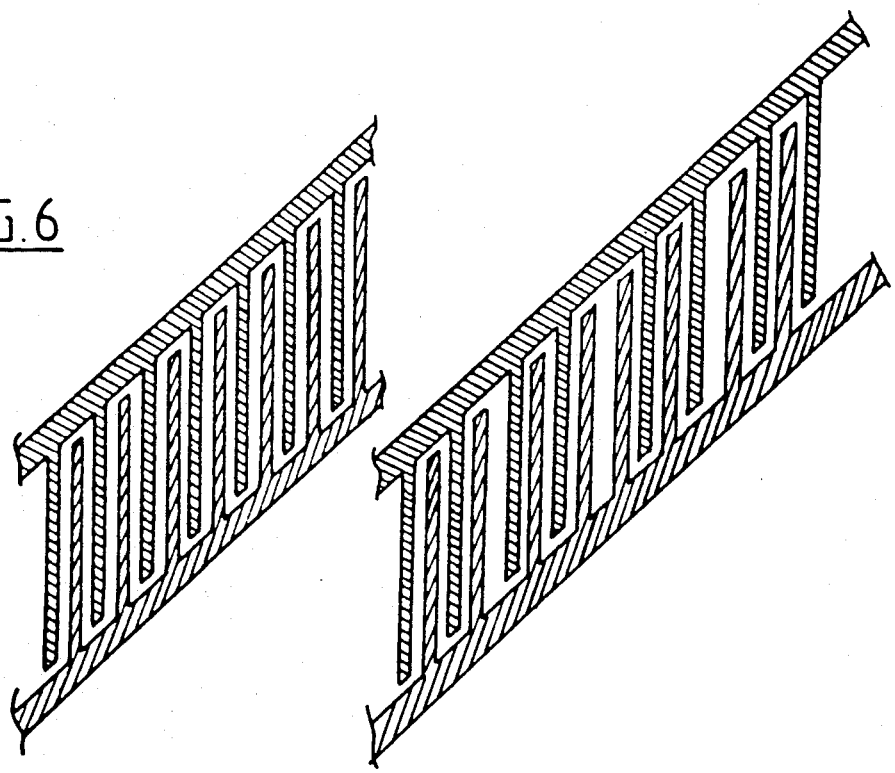
FIG. 6 illustrates another example of the devices improved in accordance with the invention.

The above description given with reference to FIG. 5 is applicable to triplets of fingers, but the same principles can also be applied to groups of four or more fingers. An example with four fingers is illustrated in FIG. 6. By way of comparison, the Applicant has produced two delay lines linked to basic structures with single fingers, that is to say whose width is a quarter of the length of the instantaneous wave.

The distribution or elementary attachment sequence of FIG. 3 may be represented by the periodical sequence of the digits:

1,0, −1,0,1,0, −1,0 where 1 designates a finger attached at the top, 0 a space with the width of a quarter of the length of the instantaneous wave, and −1 a finger attached at the bottom with the width of the finger being a quarter of the length of the instantaneous wave.

That of FIG. 4 (binary fingers), then has the form of:
1,0,1,0, −1,0, −1,0,1,0,1,0, −1,0, −1,0 with a width of finger of one eighth of the instantaneous wavelength.

The proposed new structures have a finger width of a quarter wave, but with modified attachment sequences, of higher spacial periodicity, in particular:

in FIG. 5 (on the right "groups of 3")
1,0, −1,0,1,0,0,1,0, −1,0,1,0,0 in FIG. 6 (on the right "group of 4")
1,0, −1,0,1,0, −1,0,0,1,0, −1,0,1,0, −1,0,0
−1,0,1,0, −1,0,1,0,0, −1,0,1,0, −1,0,1,0,0

These elementary sequences are then repeated until the dispersion characteristics desired for the device are obtained.

A first delay line has been produced with two strictly single finger structures. A second delay line has been produced with one single finger structure and a new structure in accordance with the invention, as illustrated in FIG. 5 (subject to the comment that the new structure could be equally well placed on the left and the conventional structure on the right).

The triple echo levels were −24 dB for the conventional delay line, as against −50 dB for the new delay line in accordance with the present invention. The new delay line has, moreover, an excellent frequency response as far as the amplitude is concerned, without the usual undulations due to the triple echo.

It was also possible to observe only a very small variation of the group time over the whole of the effective band, which, so far, has been difficult to obtain.

Of course, the preceding considerations and the description given with reference to single finger structures, could also apply to binary finger structures.

Moreover, the invention is in no way restricted to the particular application examples described. It can in point of fact extend to any device using rows of fingers that are acoustically coupled by surface waves for the purpose of processing electromagnetic signals.

We claim:

1. An acoustic surface wave device, comprising:
    (a) a piezo-electric substrate having a planar main face,
    (b) a first transducing means having:
        (i) a first row of conductive fingers spread over said planar main face along a first general direction of extension,
        (ii) said fingers of said first row having an individual geometry and being arranged according to a first preselected distribution scheme to define a first arrangement of fingers and interfinger spacings along said first general direction of extension;

(c) a second transducing means having:
  (i) a second row of conductive fingers spread over said planar main face along a second general direction of extension,
  (ii) said fingers of said second row having an individual geometry and being arranged according to a second preselected distribution scheme to define a second arrangement of fingers and interfinger spacings along said second general direction of extension;

(d) said first and second transducing means being capable of cooperating with each other via surface acoustic waves propagating on said planar main face to produce a device having acoustic coupling over a wide frequency bandwidth with selected frequency and time characteristics of transmission between said first and second transducing means in response to said first and second arrangements of said first and second rows of fingers on said planar main face and to the relative positioning of said first and second rows of fingers on said planar main face;

(e) one of said first and second preselected distribution schemes comprising a substantially periodical modification by addition of a gap corresponding to two interfinger spacings of said one distribution scheme.

2. A device according to claim 1, wherein said fingers of the first and second rows are parallel to each other, and have individual widths which vary progressively along each row in corresponding manner to cover a very wide frequency bandwidth.

3. A device according to claim 2, wherein the width of one said finger is substantially a predetermined submultiple of half the instantaneous wavelength of the associated acoustic wave, while said interfinger spacing is substantially equal to this submultiple.

4. A device according to claim 1, wherein said gap constituting the substantially periodical modification occurs after every third or fourth said finger.

5. A device according to claim 2, wherein said first and second general directions of extension are inclined differently along the perpendicular to the direction of said fingers, which impart dispersive line characteristics to the transducer.

6. A device according to claim 2, wherein said first and second general directions of extension have substantially the same inclination along the perpendicular to the direction of said fingers, which impart nondispersive line characteristics to the transducer.

7. A device according to claim 1, wherein at least one of the said transducer means further comprises a pair of common electrodes extending on either side of the corresponding row of fingers, with the distribution scheme of said row of fingers further comprising means for connecting each finger to either one or the other of said common electrodes.

8. A device according to claim 7, wherein said one transducer means which has the modified distribution scheme is the one provided with said pair of common electrodes, and said modified distribution scheme comprises a substantially periodical configuration where two consecutive one of said fingers, separated by said gap, are connected to the same one of said pair of common electrodes.

9. A device according to claim 7, wherein said modified distribution and connection scheme comprises consecutive pairs of groups of said fingers similarly connected to the said common electrodes, each said group having a gap spacing to the adjacent group which is twice the interfinger spacing within the group.

10. A device according to claim 9, wherein each group comprises three fingers.

11. A device according to claim 9, wherein each group comprises four fingers.

* * * * *